United States Patent [19]

Lunn

[11] 4,336,586
[45] Jun. 22, 1982

[54] LINEAR FULL WAVE RECTIFIER CIRCUIT

[75] Inventor: Gerald K. Lunn, Scottsdale, Ariz.

[73] Assignee: Motorola, Inc., Schaumburg, Ill.

[21] Appl. No.: 220,329

[22] Filed: Dec. 29, 1980

[51] Int. Cl.³ .......................................... H02M 7/217
[52] U.S. Cl. ..................................... 363/127; 328/26; 329/166
[58] Field of Search .......................... 307/261; 328/26; 329/166; 330/273; 363/127

[56] References Cited

U.S. PATENT DOCUMENTS

| | | | |
|---|---|---|---|
| 4,053,796 | 10/1977 | Van de Plassche | 363/127 X |
| 4,069,460 | 1/1978 | Sauer | 328/26 X |
| 4,158,882 | 6/1979 | Citta | 363/127 |
| 4,187,537 | 2/1980 | Avicola et al. | 363/127 |

OTHER PUBLICATIONS

Wheatley, "Transformerless Full-Wave Rectifier", RCA Technical Note 913, Aug. 24, 1972, 2 sheets.

Primary Examiner—A. D. Pellinen
Attorney, Agent, or Firm—Michael D. Bingham

[57] ABSTRACT

A circuit and method for producing a signal that is nearly a perfect full wave rectified version of an applied alternating signal. The circuit comprises first and second identical non-linear symmetrical rectifiers each having a respective output coupled to a current mirror circuit. In response to the alternating signal being applied to the input of the first rectifier a full wave rectified signal is produced at the output thereof to drive the current mirror such that at the output thereof, which is coupled to the output of the second rectifier, there appears a signal identical to the output from the first rectifier. This signal is utilized to produce an input signal to the second rectifier to constrain the output signal therefrom to be identical to the output signal from the current mirror circuit. The input signal to the second rectifier is thus a perfect full wave rectified version of the input signal applied to the first rectifier.

6 Claims, 6 Drawing Figures

LINEAR FULL WAVE RECTIFIER CIRCUIT

CROSS REFERENCE TO RELATED APPLICATION

"Linear Full Wave Rectifier and Method for Providing Full Wave Rectified Signals", by William E. Main et al., Ser. No. 220,328, filed on even date herewith and assigned to the assignee of the present invention.

BACKGROUND OF THE INVENTION

1. Field of the Invention

This invention relates to rectifiers and more particularly to a full wave rectifier suitable to be utilized in high speed, wide band input signal applications that can be fabricated in monolithic integrated circuit form and which exhibits excellent linearity between the output signal and the applied input signal thereto.

2. Description of the Prior Art

The prior art is replete with full wave rectifiers that are used in a myriad of applications. For instance, full wave rectifiers are commonly used in amplitude demodulation and amplitude measurement systems. Full wave rectifiers also may be utilized for video detection and are found as part of the video detector portions of television receivers to remove the video signal from the television composite carrier signal.

Some contemporary rectifiers that may be used in high speed, wide-band input signal schemes have a major problem associated therewith. In order to operate efficiently at high speeds contemporary full wave rectifiers are generally direct current biased at a quiescent operating point. As will be more fully explained later, the effect of direct current biasing causes these full wave rectifiers to have a non-linear transfer characteristic. Hence, the output signal is not an exact reproduction of the two halves of the applied alternating signal.

Another problem associated with some prior art detectors utilized, for example, as video detectors in a television set is that these detectors require a tuned circuit at the television carrier frequency. A typical example of such prior art is the Motorola Inc., MC1330 low level video detector integrated circuit which requires a tuned circuit. The tuned circuit may cause phase related problems in the television receiver as well as spurious feedback to the high sensitivity input terminals of the integrated circuit which is undesirous. Additionally, the need for a tuned circuit requires external terminals be provided between the integrated circuit and the tuned circuit which is undesirable.

Thus, a need exists for a linear full wave rectifier for operation in high speed applications and which may be utilized for example in video detection systems without the need for a tuned circuit.

SUMMARY OF THE INVENTION

Accordingly, it is an object of the present invention to provide an improved full wave rectifier having excellent high frequency performance.

It is another object of the present invention to provide a full wave rectifier circuit for high speed, wide band input signal applications.

Still another object of the present invention is to provide a full wave rectifier circuit suitable for fabrication in monolithic integrated circuit form.

One other object of the present invention is to provide a full wave rectifier circuit to be utilized as the video detector of a television receiver which requires no tuned circuit for operation.

In accordance with the above and other objects there is provided a full wave rectifier comprising a first full wave rectifier circuit adapted to receive an alternating input signal; a current mirror circuit having an input coupled to the output of the first full wave rectifier and an output for producing an output signal substantially identical to the output signal produced at the output of the first full wave rectifier circuit; a second full wave rectifier having an output coupled to the output of the current mirror circuit; and a circuit coupled between the output of the current mirror circuit and the input of the second full wave rectifier circuit for providing a full wave rectified input signal to the second full wave rectifier such that the output of the second full wave rectifier is constrained to be equal to the output signal appearing at the output of the current mirror circuit whereby the input signal to the second rectifier circuit is substantially a full wave rectified version of the alternating signal applied to the input of the first rectifier circuit.

DESCRIPTION OF THE PREFERRED EMBODIMENTS

Figure 1:
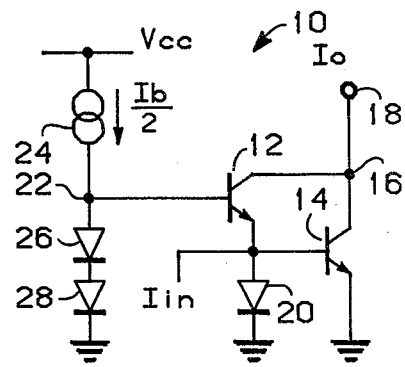
FIG. 1 is a schematic drawing of a full wave rectifier having a non-linear transfer characteristic which may be utilized in the present invention.

A full wave rectifier 10 is shown in FIG. 1 which exhibits a non-linear transfer characteristic. Full wave rectifier 10 comprises transistors 12 and 14 which have collectors summed together at node 16 to output terminal 18 with the emitter of transistor 12 being connected to the base of transistor 14. The emitter of transistor 14 is returned to a terminal at which is provided a ground reference potential. A diode 20 is connected between the base and the emitter of transistor 14 with the interconnection between the emitter of transistor 12 and the anode of diode 20 being adapted to receive an alternating input signal $I_{IN}$ thereat. In order to operate in high speed applications, transistors 12 and 14 must be DC biased at a quiescent operating point which is determined by the circuit connected at node 22 to the base of transistor 12 comprising current source 24 coupled between a source of operating potential $V_{CC}$ and node 22 to serially connected diodes 26 and 28.

As configured, a positive going input current supplied at the interconnection of the emitter of transistor 12 and the anode of diode 20 will increase the current through the diode which increases the current through the collector-to-emitter path of transistor 14 to increase the output current, $I_O$. Likewise, a negative going current increases the collector-to-emitter current through transistor 12. Thus, applied alternating input current, $I_{IN}$, having both positive and negative going halves, produces a full wave rectified output current $I_O$ at output terminal 18.

Figure 2:
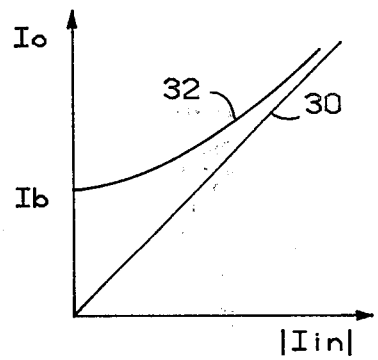
FIG. 2 is a graph illustrating the non-linear transfer characteristics of the non-linear full wave rectifier of FIG. 1.

FIG. 2 illustrates the linearity between the output current $I_O$ and the absolute magnitude of the applied input current $I_{IN}$. Straight line 30 represents the ideal output if rectifier 10 had a linear transfer characteristic, i.e., the output current was a direct function of the applied input signal. However, as shown by the curve 32, the output of full wave rectifier 10 asymptotically approaches straight line 30 and is only linear for the input signal $I_{IN}$ being much greater than the bias current $I_B$. Hence, since the bias current is necessary to provide a low impedance at the input and to give good high frequency performance, the output of full wave rectifier 10 becomes non-linear at lower input current signal magnitudes.

Figure 3:
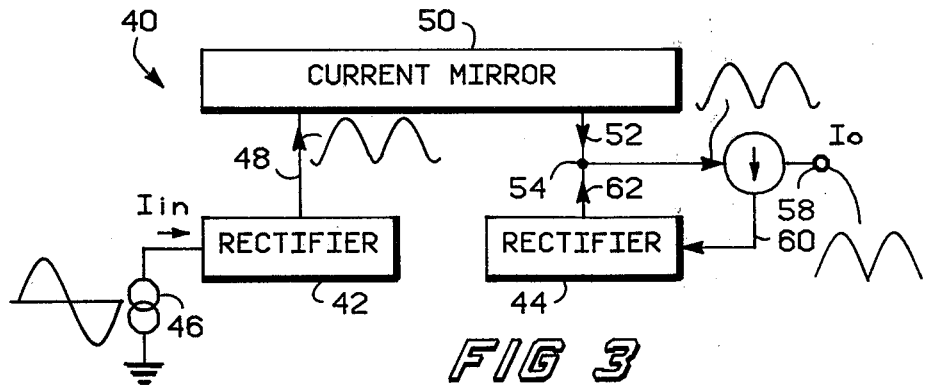
FIG. 3 illustrates in block diagram form the preferred embodiment of the present invention.

Turning to FIG. 3 there is shown a substantially linear full wave rectifier 40 of the present invention. Full wave rectifier 40 is illustrated as including first and second non-linear rectifiers 42 and 44 respectively which, for example, may be identical to non-linear rectifier 10 of FIG. 1. As illustrated, symmetrical full wave rectifier 42 receives an alternating input current $I_{IN}$ supplied from current source 46 at an input thereof to provide a full wave rectified output signal at the output thereof. As previously discussed, non-linear rectifier 42 may not have a perfect linear transfer characteristic such that the full wave rectified output signal appearing at lead 48 has non-linearities therein due to the biasing problems previously discussed. The full wave rectified output signal from rectifier 42 provides an input current to current mirror 50 which produces an output current over lead 52 which is substantially identical to the full wave rectified output signal from rectifier 42. Non-linear rectifier 44 which as an identical transfer characteristic to rectifier 42 is provided an input signal via lead 60 from a current feedback source 56 which is coupled to node 54. Thus, in order for the full wave rectified output signal appearing at the output of rectifier 44 via lead 62 to be identical to the full wave rectified signal produced at the output of current mirror 50, the full wave rectified signal supplied to the input thereof from current feedback source 56 must be a substantially perfect full wave rectified version of the two alternating halves of the applied alternating signal. Hence, the output current $I_O$ appears at terminal 58 is a perfect reproduction of the alternating halves of the input current $I_{IN}$. Therefore, a substantially perfect full wave rectified output signal can be produced from an alternating input signal by utilizing two non-linear but symmetrical full wave rectifiers having substantially identical transfer characteristics.

Figure 4:
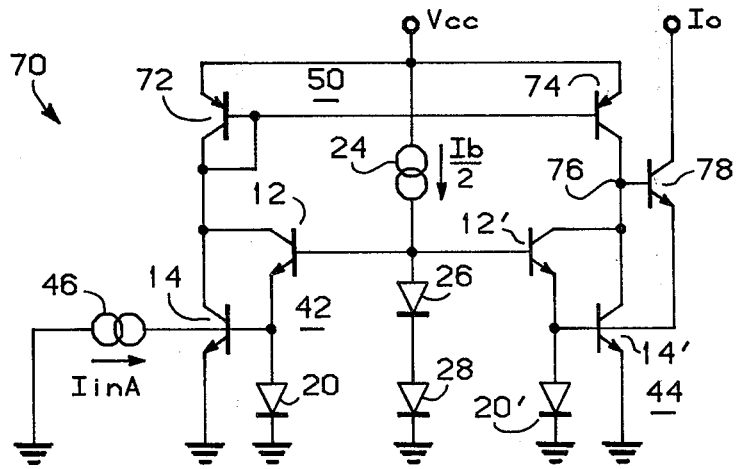
FIG. 4 is a schematic diagram illustrating a single ended input full wave rectifier of the present invention.

Linear full wave rectifier 70 which shown in FIG. 4 illustrates one preferred embodiment of the present invention utilizing the non-linear symmetrical full wave rectifier shown in FIG. 1 for example. It is noted that components in FIG. 4 corresponding to like components in FIG. 1 are designated by the same reference numerals. Thus, non-linear rectifier 42 is illustrated as comprising transistors 12, 14 and diode 20 connected in the same manner as illustrated in FIG. 1 with the base of transistor 12 receiving a bias current through the bias circuit comprising current source 24 and diodes 26 and 28. Similarly, non-linear symmetrical full wave rectifier 44 is shown as comprising transistors 12', 14' and diode 20' configured in an identical manner as described in FIG. 1 for full wave rectifier 10. Full wave rectifier 44 is biased from current source 24 as understood.

In response to an input current $I_{IN}$ provided by alternating current source 46 which is applied to the base of transistor 14 (the input of rectifier 42) a full wave rectified output signal is produced at the interconnection of the collectors of transistors 12 and 14 which provides the input current to current mirror 50. Current mirror 50 is illustrated as including diode connected transistor 72 and transistor 74 connected in a well known current mirror configuration. Thus, the non-linear full wave rectified current appearing at the output of rectifier 42 flows through the collector-emitter path of transistor 72 to cause an output non-linear full wave rectified current to appear at the collector of transistor 74, at node 76. This output current from current mirror 50 provides base drive to transistor 78 which produces the input signal to full wave rectifier 44 at the base of transistor 14'. This input current produces an output current which is summed at the collectors of transistors 12' and 14', at node 76, which is constrained to be identical to the output current from current mirror 50. Thus, in order for the full wave rectified output signal from rectifier 44 to be identical to the output full wave rectified signal appearing at the output of full wave rectifier 42 means that the input signal through the collector-emitter of transistor 78 must be a nearly perfect reproduction of the two halves of the alternating input signal $I_{IN}$. Thus, the output current $I_O$ appearing at the collector of transistor 78, the output of linear full wave rectifier 70, is substantially a perfect full wave rectified version of the input signal to the full wave rectifier circuit.

Figure 5:
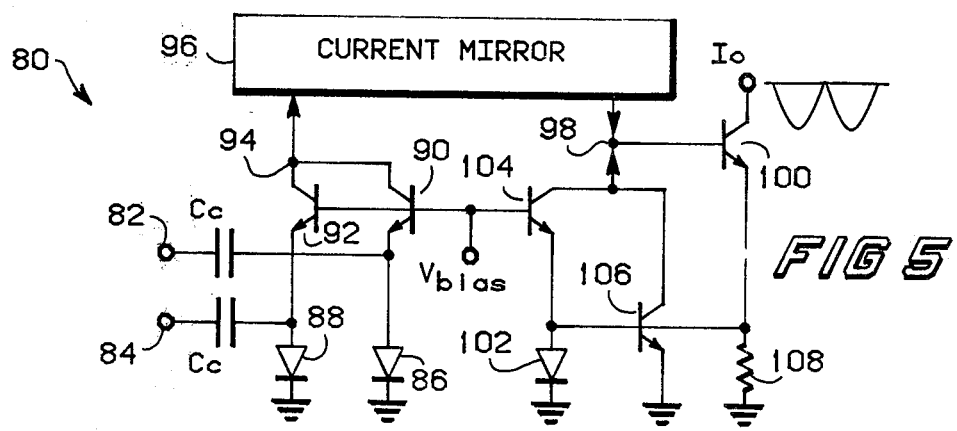
FIG. 5 is a schematic and block diagram of a full wave rectifier of an embodiment of the present invention.

FIG. 5 illustrates another embodiment of the present invention which is adapted to differentially receive an alternating input signal. Full wave rectifier 80 of FIG. 5 is shown as having differential input terminals 82 and 84 at which an applied alternating input signal appears. The differential input signal is coupled via coupling capacitors CC to the anodes of diodes 86 and 88. Diodes 86 and 88 are connected respectively between a ground reference potential and the emitters of transistors 90 and 92 which have the collectors thereof connected at summing node 94. The bases of transistors 90 and 92 are coupled to a bias voltage. In response to the alternating input signal applied at terminals 82 and 84 transistors 90 and 92 are rendered alternately conducting or non-conducting as previously explained such that a full wave rectified output signal appears at node 94. A current mirror or current turn around circuit 96 is shown which is driven at the input thereof by the output signal from transistors 90 and 92 to produce a substantially identical output signal at node 98. This output signal is utilized to drive transistor 100 in the same manner as discussed above with respect to transistor 78 (FIG. 4) to provide an input signal to the input of full wave rectifier 44 which is shown as comprising diode 102 and transistors 104 and 106 configured in the same manner as described for full wave rectifier 42 of FIG. 4. Hence the output current at terminal 109, $I_O$, is a nearly perfect full wave rectified version of the input signal applied between terminals 82 and 84.

Figure 6:
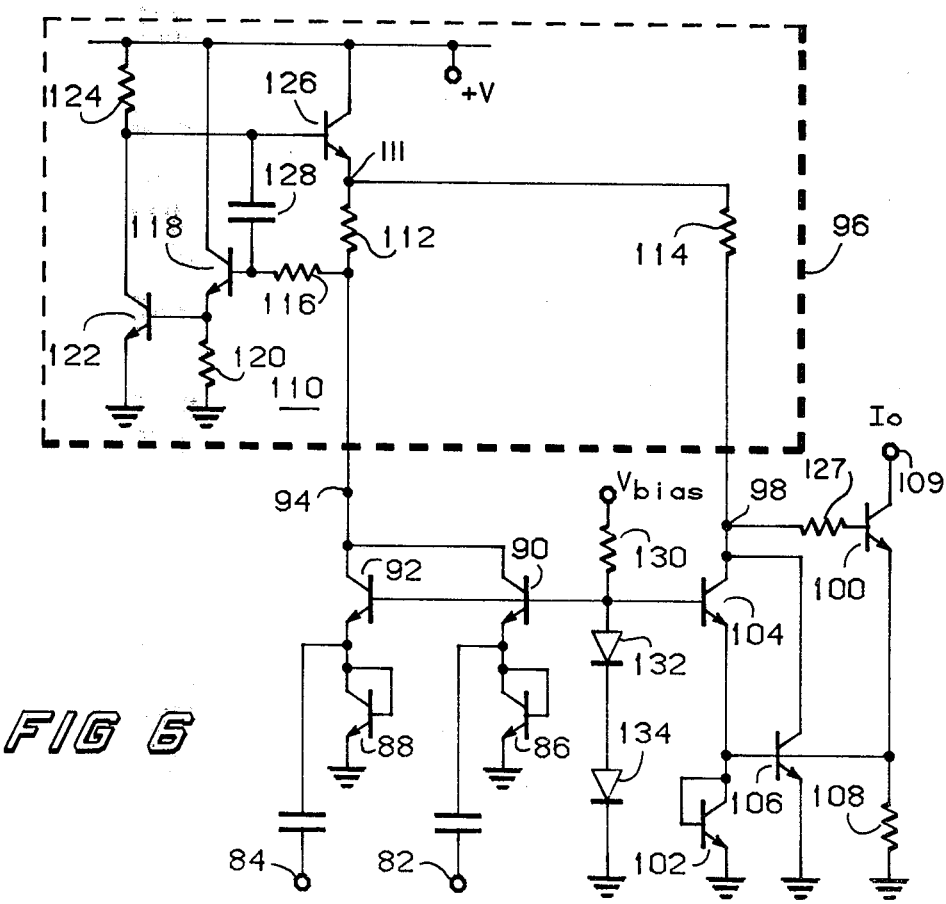
FIG. 6 is a schematic diagram illustrating the full wave rectifier of FIG. 5 in complete detail.

Turning to FIG. 6 current mirror 96 is shown in detail and is useful for explaining the operation thereof. The full wave rectified signals appearing at node 94 are applied to the input of amplifier 110 through resistor 116. The output of amplifier 110 is taken at node 111 and is supplied to resistors 112 and 114 which are substantially equal in value. By holding both nodes 94 and 98 at the same voltage (here two diode voltage drops above ground potential) and making the gain of amplifier 110 sufficiently high, the change in voltage at node 94 appears at node 111 such that equal currents flow through resistors 112 and 114. Thus, the current flowing at node 98 is substantially identical to the full wave rectified current flowing at node 94.

Amplifier 110 comprises transistor 118, which is the input stage of amplifier 110, coupled to resistor 116. Transistor 118 is coupled in an emitter-follower configuration with resistor 120 to the base of transistor 122 such that, for example, when transistor 92 is turned on, transistors 118 and 122 are turned off which increases the voltage at the collector of transistor 122. This causes buffer transistor 126 to be rendered conductive to change the voltage at the top of resistors 112 and 114 (nodes 94 and 98 being at virtual ground) and thus producing equal and like currents therethrough. Thus, the output signal from current mirror 96 appearing at node 98 is substantially identical to the full wave rectified signal developed at node 94. The signal at node 98 drives transistor 100 via resistor 127 which in turn drives the rectifier input coupled between the emitter of this transistor and resistor 108. Essentially, transistor 100 therefore compares the output of current mirror 96 with the output of the rectifier at node 98 and constrains this output to be equal with the current mirror output. Hence, the output signal at terminal 109 is a perfect full wave rectified version of the alternating input signal.

Resistor 108 is utilized to bias transistor 100 at a quiescent operating point in order that the output signal at terminal 109 rides about a DC bias level. The DC bias for full wave rectifier as previously suggested is provided between the interconnection of resistor 130 and serially connected diodes 132, 134. As shown by example, diodes 86, 88, 102 may be formed by using diode connected transistor as well may be remaining diodes 132 and 134.

Thus, what has been described above, is a method and circuit for producing a full wave rectified output signal which is linearly related to an alternating signal applied to the input of the full wave rectifier circuit. The full wave rectifier circuit comprises a pair of identical non-linear but symmetrical full wave rectifiers each having its output coupled to a current mirror. The input of the first rectifier is adapted to receive an alternating input signal such that at the output of the current mirror which is coupled to the output of the second rectifier there appears a full wave rectified output signal identical to the full wave rectified output signal produced by the first rectifier. A current feedback source coupled to the output of the current mirror provides an input signal to the second rectifier such that the output of the second rectifier is constrained to be identical to the output of the first rectifier. Thus, the input signal to the second rectifier is a perfect full wave rectified version of the input signal to the first rectifier since the input to the second rectifier is constrained to have one polarity.

I claim:

1. A full wave rectifier, comprising:
   first rectifier means adapted to receive an alternating input signal at first and second inputs for producing an output signal that is a full wave rectified version of said alternating input signal;
   current turnaround means responsive to said output signal from said first rectifier means for producing an output signal at an output substantially identical to said output signal from said first rectifier means;
   second rectifier means coupled to said output of said current turnaround means having a substantially identical transfer characteristic to said first rectifier means; and
   circuit means coupled between said output of said current turnaround means and said second rectifier means for providing feedback to said second rectifier means such that the signal appearing between said output of said current turnaround means and said second rectifier means is substantially an exact full wave rectified version of said alternating input signal.

2. The full wave rectifier of claim 1 wherein said first rectifier means includes;
   a first transistor having first, second and control electrodes, said first electrode being coupled to said first input, said second electrode being coupled to the output of said first rectifier means, said control electrode being coupled to a first terminal at which is supplied a bias potential; and
   a second transistor having first, second and control electrodes, said first electrode being coupled to said second input, said second electrode being coupled to said output and said control electrode being coupled to said first terminal.

3. The full wave rectifier of claim 2 wherein said first rectifier means includes:
   first diode means having first and second electrodes, said first electrode being coupled to said first electrode of said first transistor, said second electrode being coupled to a second terminal at which is supplied a ground reference potential and
   second diode means having first and second electrodes, said first electrode being coupled to said first electrode of said second transistor and said second electrode being coupled to said second terminal.

4. The full wave rectifier of claim 1 or 3 wherein said second rectifier means includes:
   a third transistor having first, second and control electrodes, said first electrode being coupled to said second terminal, said second electrode being coupled to said output of said current turnaround means, said control electrode being adapted to receive said feedback from said circuit means;
   third diode means having first and second electrodes, said first electrode being coupled to said control electrode of said third transistor, said second electrode being coupled to said second terminal; and
   a fourth transistor having first, second and control electrodes, said first electrode being coupled to said first electrode of said third diode means, said second electrode being coupled to said second electrode of said third transistor and said control electrode being coupled to said first terminal.

5. The full wave rectifier of claim 4 wherein said current turnaround means includes:
   a first resistor;
   an amplifier having an input and output, said output and input being coupled across said first resistor with said input being also coupled to said output of said said first rectifier means; and
   a second resistor of substantially equal value to said first resistor, said second resistor being coupled between said output of said amplifier and said output of said current turnaround means.

6. The full wave rectifier of claim 5 wherein said circuit means includes a fifth transistor having first, second and control electrodes, said first electrode being coupled to said control electrode of said third transistor, said control electrode being coupled to said output of said current turnaround means and said second electrode being coupled to an output of the full wave rectifier.

* * * * *